(12) United States Patent
Lee et al.

(10) Patent No.: US 12,557,532 B2
(45) Date of Patent: Feb. 17, 2026

(54) DISPLAY APPARATUS

(71) Applicant: Samsung Display Co., Ltd., Yongin-si (KR)

(72) Inventors: Kyunghee Lee, Yongin-si (KR); Mihwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 695 days.

(21) Appl. No.: 17/875,227

(22) Filed: Jul. 27, 2022

(65) Prior Publication Data

US 2023/0165040 A1 May 25, 2023

(30) Foreign Application Priority Data

Nov. 19, 2021 (KR) ........................ 10-2021-0160708

(51) Int. Cl.
| | |
|---|---|
| *H10K 50/844* | (2023.01) |
| *H10K 50/858* | (2023.01) |
| *H10K 59/40* | (2023.01) |
| *H10K 59/80* | (2023.01) |

(52) U.S. Cl.
CPC ........... *H10K 59/879* (2023.02); *H10K 59/40* (2023.02); *H10K 59/873* (2023.02); *H10K 59/8731* (2023.02); *H10K 50/8445* (2023.02)

(58) Field of Classification Search
CPC .... H10K 50/844; H10K 50/858; H10K 59/40; H10K 59/873; H10K 59/874; H10K 50/8445
See application file for complete search history.

(56) References Cited

U.S. PATENT DOCUMENTS

| | | | |
|---|---|---|---|
| 8,536,781 | B2 | 9/2013 | Lee et al. |
| 10,096,797 | B2 | 10/2018 | Choi et al. |
| 10,510,810 | B2 | 12/2019 | Kim et al. |
| 10,734,452 | B1 | 8/2020 | Kim et al. |
| 11,107,863 | B2 | 8/2021 | Lim et al. |
| 2006/0279854 | A1* | 12/2006 | Taniguchi ............... H05B 33/14 359/722 |
| 2018/0197921 | A1* | 7/2018 | Kim ..................... H10K 50/865 |
| 2021/0175300 | A1 | 6/2021 | Kim et al. |
| 2022/0006059 | A1* | 1/2022 | Kim ..................... H10K 50/844 |
| 2022/0285655 | A1* | 9/2022 | Lee ........................ H10K 59/87 |
| 2022/0393135 | A1* | 12/2022 | Choi ..................... H10K 71/00 |

(Continued)

FOREIGN PATENT DOCUMENTS

| | | |
|---|---|---|
| KR | 10-1076262 B1 | 10/2011 |
| KR | 10-2015-0097434 A | 8/2015 |
| KR | 10-2017-0105994 A | 9/2017 |

(Continued)

*Primary Examiner* — Mariceli Santiago
(74) *Attorney, Agent, or Firm* — Womble Bond Dickinson (US) LLP

(57) ABSTRACT

A display apparatus includes: a substrate; a display element on the substrate; an encapsulation layer on the display element, and including a dye and a first organic material; a first refractive layer on the encapsulation layer, and having an opening corresponding to the display element; and a second refractive layer covering the first refractive layer, the second refractive layer including a pigment and a second organic material, and having a refractive index different from a refractive index of the first refractive layer.

25 Claims, 8 Drawing Sheets

(56) References Cited

U.S. PATENT DOCUMENTS

2023/0031230 A1*  2/2023  Lee .................... H10K 59/878
2023/0101692 A1   3/2023  Kim et al.

FOREIGN PATENT DOCUMENTS

| KR | 10-1778291 B1    | 9/2017 |
| KR | 10-2018-0051313 A | 5/2018 |
| KR | 10-2018-0082661 A | 7/2018 |
| KR | 10-2019-0080994 A | 7/2019 |
| KR | 10-2020-0060861 A | 6/2020 |
| KR | 10-2020-0089379 A | 7/2020 |
| KR | 10-2021-0073685 A | 6/2021 |
| KR | 10-2021-0107195 A | 9/2021 |

* cited by examiner

DISPLAY APPARATUS

CROSS-REFERENCE TO RELATED APPLICATION

This application claims priority to and the benefit of Korean Patent Application No. 10-2021-0160708, filed on Nov. 19, 2021, in the Korean Intellectual Property Office, the entire disclosure of which is incorporated by reference herein.

BACKGROUND

1. Field

Aspects of one or more embodiments of the present disclosure relate to a display apparatus, and more particularly, to a display apparatus capable of reducing the possibility of an occurrence of contamination between layers thereof.

2. Description of the Related Art

Electrodes and other metal wires of a display element included in a display apparatus may reflect light introduced from the outside. Accordingly, in such a display apparatus visibility may be decreased due to reflection of external light in a bright environment.

The above information disclosed in this Background section is for enhancement of understanding of the background of the present disclosure, and therefore, it may contain information that does not constitute prior art.

SUMMARY

In order to reduce reflection of external light, a display apparatus may include a color filter.

However, in such a display apparatus, a layer located on an upper portion of the display apparatus may be contaminated by a lower layer disposed below the layer.

One or more embodiments of the present disclosure are directed to a display apparatus capable of reducing the possibility of contamination between layers thereof.

However, the present disclosure is not limited to the aspects and features set forth above. Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate; a display element on the substrate; an encapsulation layer on the display element, and including a dye and a first organic material; a first refractive layer on the encapsulation layer, and having an opening corresponding to the display element; and a second refractive layer covering the first refractive layer, the second refractive layer including a pigment and a second organic material, and having a refractive index different from a refractive index of the first refractive layer.

In an embodiment, the dye may be soluble in the second organic material, and the second refractive layer may not include the dye.

In an embodiment, an absorbance of the dye with respect to light in a wavelength band of greater than 575 nm and less than 605 nm may be greater than an absorbance of the dye with respect to light in a wavelength band of 605 nm to 650 nm.

In an embodiment, the pigment may be insoluble in the second organic material.

In an embodiment, an absorbance of the pigment with respect to light in a wavelength band of 380 nm to 480 nm may be greater than an absorbance of the pigment with respect to light in a wavelength band of 605 nm to 650 nm.

In an embodiment, the refractive index of the second refractive layer may be greater than the refractive index of the first refractive layer.

In an embodiment, the second refractive layer may include highly refractive particles including a metal oxide.

In an embodiment, the second refractive layer may fill the opening of the first refractive layer.

In an embodiment, the encapsulation layer may include a first inorganic encapsulation layer, an organic encapsulation layer on the first inorganic encapsulation layer, and a second inorganic encapsulation layer covering the organic encapsulation layer, and the organic encapsulation layer may include the dye and the first organic material.

In an embodiment, the display apparatus may further include a low-reflection layer between the display element and the encapsulation layer, and including an inorganic material.

In an embodiment, the display apparatus may further include an input sensing layer between the encapsulation layer and the first refractive layer, and including a sensing electrode.

In an embodiment, the display apparatus may further include a protective layer on the second refractive layer, and including a protective film and an adhesive material.

In an embodiment, the encapsulation layer may further include the pigment.

According to one or more embodiments of the present disclosure, a display apparatus includes: a substrate; a display element on the substrate; an encapsulation layer on the display element, and including a dye, a pigment, and a first organic material; a first refractive layer on the encapsulation layer, and having an opening corresponding to the display element; and a second refractive layer covering the first refractive layer, the second refractive layer including a second organic material, and having a refractive index different from a refractive index of the first refractive layer.

In an embodiment, the dye may be soluble in the second organic material, and the second refractive layer may not include the dye.

In an embodiment, an absorbance of the dye with respect to light in a wavelength band of greater than 575 nm and less than 605 nm may be greater than an absorbance of the dye with respect to light in a wavelength band of 605 nm to 650 nm.

In an embodiment, the pigment may be insoluble in the second organic material.

In an embodiment, an absorbance of the pigment with respect to light in a wavelength band of 380 nm to 480 nm may be greater than an absorbance of the pigment with respect to light in a wavelength band of 605 nm to 650 nm.

In an embodiment, the refractive index of the second refractive layer may be greater than the refractive index of the first refractive layer.

In an embodiment, the second refractive layer may include highly refractive particles including a metal oxide.

In an embodiment, the second refractive layer may fill the opening of the first refractive layer.

In an embodiment, the encapsulation layer may include a first inorganic encapsulation layer, an organic encapsulation layer on the first inorganic encapsulation layer, and a second inorganic encapsulation layer covering the organic encapsulation layer, and the organic encapsulation layer may include the dye, the pigment, and the first organic material.

In an embodiment, the display apparatus may further include a low-reflection layer between the display element and the encapsulation layer, and including an inorganic material.

In an embodiment, the display apparatus may further include an input sensing layer between the encapsulation layer and the first refractive layer, and including a sensing electrode.

In an embodiment, the display apparatus may further include a protective layer on the second refractive layer, and including a protective film and an adhesive material.

The above and/or other aspects and features will become more apparent and readily appreciated from the following detailed description of the embodiments, with reference to the accompanying drawings.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
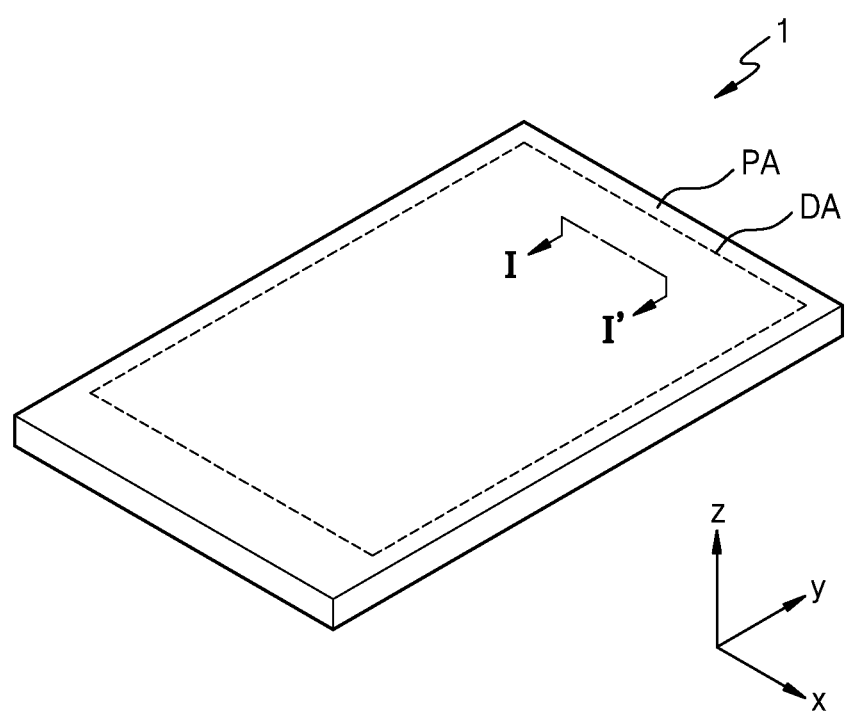
FIG. 1 is a perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a portion of a display apparatus 1 according to an embodiment.

Referring to FIG. 1, the display apparatus 1 may include a display area DA, and a peripheral area PA surrounding (e.g., around a periphery of) the display area DA. The display apparatus 1 may provide an image through an array of a plurality of pixels that are two-dimensionally arranged at (e.g., in or on) the display area DA.

Each pixel of the display apparatus 1 is an area capable of emitting light of a desired color (e.g., a certain or predetermined color), and the display apparatus 1 may provide an image using light emitted from the pixels. For example, each pixel may emit red, green, or blue light.

The display area DA may have a suitable polygonal shape including a quadrangle as shown in FIG. 1. For example, the display area DA may have a rectangular shape having a horizontal length greater than a vertical length thereof, a rectangular shape having a horizontal length less than a vertical length thereof, or a square shape. However, the display area DA may have various suitable shapes, for example, such as an ellipse or a circle.

The peripheral area PA is a non-display area that does not provide an image, and may surround (e.g., around a periphery of) the display area DA. A driver or a main power line for providing an electrical signal or power to pixel circuits may be arranged at (e.g., in or on) the peripheral area PA. The peripheral area PA may include a pad, which is an area to which an electronic device or a printed circuit board may be electrically connected.

Hereinafter, according to an embodiment, an organic light-emitting display apparatus is described as an example of the display apparatus 1, but the present disclosure is not limited thereto. In another embodiment, the display apparatus 1 may be an inorganic light-emitting display apparatus (or an inorganic EL display apparatus) or a quantum dot light-emitting display apparatus. For example, an emission layer of a display element included in the display apparatus 1 may include an organic material or an inorganic material. As another example, the display apparatus 1 may include an emission layer, and a quantum dot layer on a path of light emitted from the emission layer.

Figure 2:
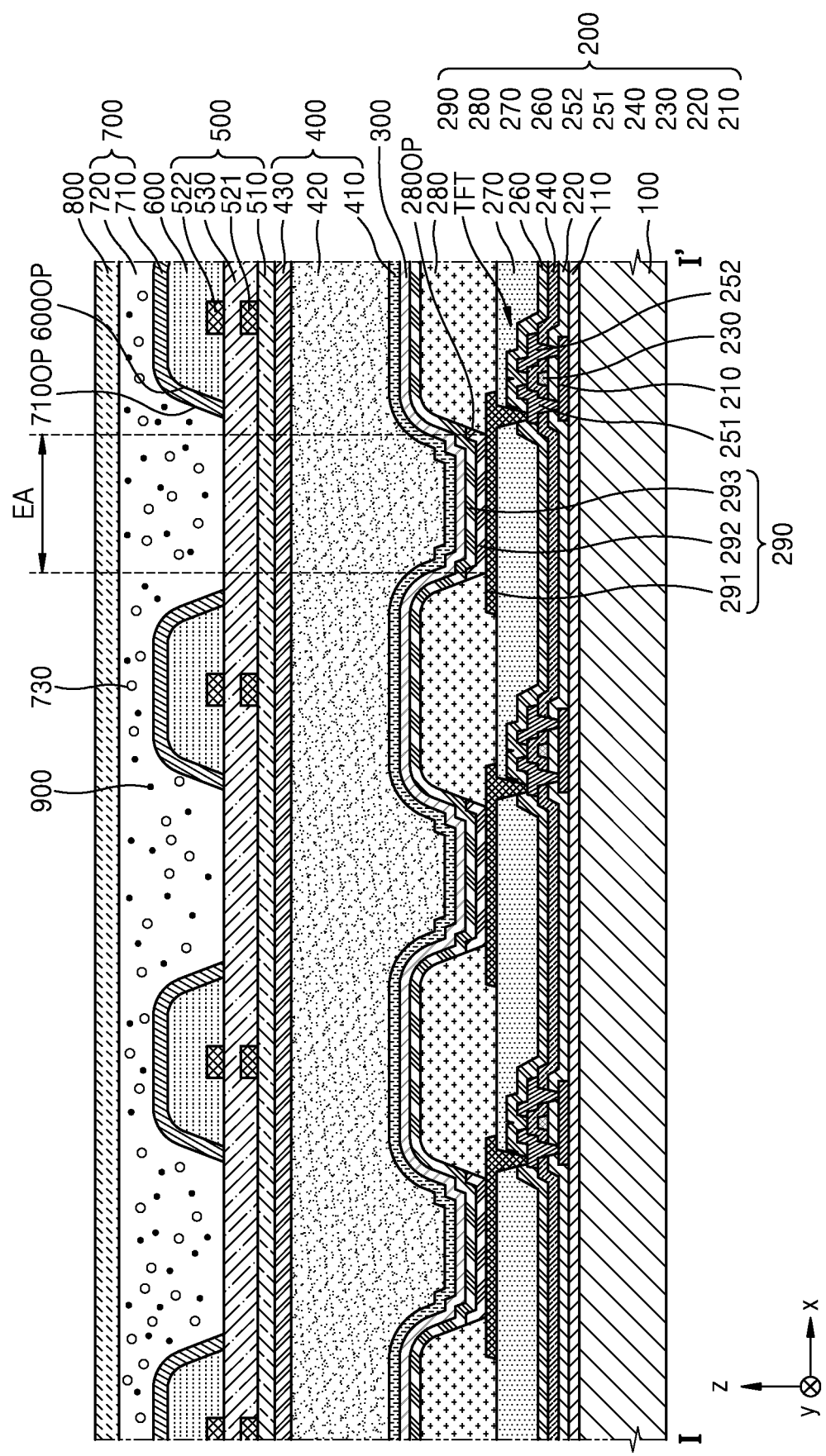
FIG. 2 is a schematic cross-sectional view of the display apparatus taken along the line I-I' of FIG. 1.

FIG. 2 is a schematic cross-sectional view of a portion of the display apparatus 1 according to an embodiment. In more detail, FIG. 2 is a cross-sectional view of the display apparatus 1 taken along the line I-I' of FIG. 1.

Referring to FIG. 2, the display apparatus 1 may include a substrate 100, a display element layer 200, a low reflection layer 300, an encapsulation layer 400, an input sensing layer 500, a refractive layer 700, and a protective layer 800.

The substrate 100 may include glass, metal, or a polymer resin. The substrate 100 may have flexible and/or bendable characteristics. In this case, the substrate 100 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. In addition, the substrate 100 may have a multilayered structure including two layers including the polymer resin, and a barrier layer including an inorganic material (e.g., such as silicon oxide, silicon nitride, silicon oxynitride, and/or the like) between the two layers, but various modifications may be made thereto.

A buffer layer 110 including silicon oxide, silicon nitride, or silicon oxynitride may be disposed on the substrate 100. The buffer layer 110 may serve to increase a smoothness of an upper surface of the substrate 100, and may prevent or substantially prevent diffusion of metal atoms and/or impurities from the substrate 100 to a semiconductor layer 210 disposed thereon. The buffer layer 110 may include (e.g., may be) a single layer or multiple layers including silicon oxide, silicon nitride, or silicon oxynitride.

The display element layer 200 may be on the buffer layer 110. The display element layer 200 may include a display element 290, and a thin-film transistor TFT electrically connected to the display element 290. In FIG. 2, an organic light-emitting device is shown as an example of the display element 290 on the buffer layer 110. The organic light-emitting device is electrically connected to the thin-film transistor TFT. For example, a pixel electrode 291 of the organic light-emitting device is electrically connected to the thin-film transistor TFT.

As shown in FIG. 2, the thin-film transistor TFT includes the semiconductor layer 210, a gate electrode 230, a source electrode 251, and a drain electrode 252. The semiconductor layer 210 may include amorphous silicon, polycrystalline silicon, an oxide semiconductor material, or an organic semiconductor material. A gate-insulating layer 220 may be between the semiconductor layer 210 and the gate electrode 230, to insulate the semiconductor layer 210 from the gate electrode 230. The gate-insulating layer 220 may include an inorganic material, such as silicon oxide, silicon nitride, and/or silicon oxynitride. A first interlayer insulating layer 240 may be on the gate electrode 230. The first interlayer-insulating layer 240 may include an inorganic material, such as silicon oxide, silicon nitride, and/or silicon oxynitride. The source electrode 251 and the drain electrode 252 may be on the first interlayer-insulating layer 240, and may penetrate the first interlayer-insulating layer 240 to be connected to the semiconductor layer 210. A second interlayer insulating layer 260 may be disposed to cover the source electrode 251 and the drain electrode 252.

A planarization layer 270 may be on the thin-film transistor TFT. For example, as shown in FIG. 2, when the organic light-emitting device is on the thin-film transistor TFT, the planarization layer 270 may generally flatten (e.g., may flatten or substantially flatten) an upper portion (e.g., an upper surface) of the thin-film transistor TFT. The planarization layer 270 may include an organic material, such as acryl, benzocyclobutene (BCB), or hexamethyldisiloxane (HMDSO). Although the planarization layer 270 is shown as a monolayer in FIG. 2, the planarization layer 140 may be multilayered, and various suitable modifications thereto may be made.

The display element 290 may be on the planarization layer 270 at (e.g., in or on) the display area DA of the display element layer 200. The display element 290 may be, for example, an organic light-emitting device including the pixel electrode 291, an opposite electrode 293, and an intermediate layer 292 including an emission layer interposed between the pixel electrode 291 and the opposite electrode 293.

As shown in FIG. 2, the pixel electrode 291 is electrically connected to the thin-film transistor TFT by contacting any one of the source electrode 251 and the drain electrode 252 through an opening formed in (e.g., penetrating) the planarization layer 270 and/or the like. The pixel electrode 291 includes a light-transmitting conductive layer formed of a light-transmitting conductive oxide, for example, such as ITO, $In_2O_3$, or IZO, and a reflective layer formed of a metal, for example, such as Al or Ag. For example, the pixel electrode 291 may have a three-layered structure of ITO/Ag/ITO.

A pixel-defining layer 280 may be on the planarization layer 270. The pixel defining layer 280 defines a pixel (e.g., a pixel area) by having a first opening 280OP corresponding to each pixel, or in other words, a corresponding first opening 280OP exposing at least a center of the pixel electrode 291 of each pixel. Furthermore, as shown in FIG. 2, the pixel-defining layer 280 prevents or substantially prevents the generation of an arc and/or the like at an edge of the pixel electrode 291 by increasing a distance between the edge of the pixel electrode 291 and the opposite electrode 293 disposed over the pixel electrode 291. The pixel-defining layer 280 may include an organic material, such as polyimide or HMDSO.

The intermediate layer 292 of the organic light-emitting device may include a low-molecular weight material, or a high molecular weight material such as a polymer material. When the intermediate layer 292 includes a low-molecular weight material, the intermediate layer 292 may have a single or composite structure by stacking a hole injection layer (HIL), a hole transport layer (HTL), an emission layer (EML), an electron transport layer (ETL), and an electron injection layer (EIL), and may be formed by a vacuum deposition method. When the intermediate layer 292 includes a high molecular weight material, for example, such as a polymer material, the intermediate layer 292 may have a structure including an HTL and an EML. The HTL may include PEDOT, and the EML may include a polymer material, for example, such as poly-phenylenevinylene (PPV) and/or polyfluorene. The intermediate layer 292 may be formed by using a screen printing method, an ink jet printing method, or a laser induced thermal imaging (LITI) method. However, the intermediate layer 292 is not limited thereto, and may have various suitable structures. In addition, the intermediate layer 292 may include an integral layer over a plurality of pixel electrodes 291, or may have a layer that is patterned to correspond to each of the pixel electrodes 291.

The opposite electrode 293 may be on the display area DA to cover the display area DA. In other words, the opposite electrode 293 may be integrally formed for a plurality of organic light-emitting devices to correspond to a plurality of pixel electrodes 291. The opposite electrode 293 may include a light-transmitting conductive layer formed of ITO, $In_2O_3$, or IZO, and/or a semi-transparent film including a metal, such as Al or Ag. For example, the opposite electrode 293 may be a semi-transparent film including Mg or Ag.

The low reflection layer 300 may be on the display element layer 200. In more detail, the low reflection layer 300 may be between the display element layer 200 and the encapsulation layer 400. The low reflection layer 300 may include an inorganic material having a low reflectance. The low reflection layer 300 may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or a suitable combination thereof. The inorganic material included in the low reflection layer 300 may have an absorption coefficient of 0.5 or more.

The low reflection layer 300 may induce a destructive interference between light incident into the display apparatus 1 and light reflected by a metal below the low reflection layer 300, to reduce external light reflection. Accordingly, by reducing external light reflectance of the display apparatus 1 through the low reflection layer 300, display quality and visibility of the display apparatus 1 may be improved.

The encapsulation layer 400 may be on the low reflection layer 300. The encapsulation layer 400 may cover the display area DA, and may extend to the outside of the display area DA. The encapsulation layer 400 may include a first inorganic encapsulation layer 410, an organic encapsulation layer 420, and a second inorganic encapsulation layer 430 as shown in FIG. 2.

The first inorganic encapsulation layer 410 covers the low reflection layer 300, and may include silicon oxide, silicon nitride, and/or silicon oxynitride. A shape of the first inorganic encapsulation layer 410 is formed in accordance with a shape of a structure disposed therebelow, and thus, as shown in FIG. 2, an upper surface of the first inorganic encapsulation layer 410 is not flat.

The organic encapsulation layer 420 covers the first inorganic encapsulation layer 410. However, unlike the first inorganic encapsulation layer 410, an upper surface of the organic encapsulation layer 420 may be formed to be generally flat (e.g., to be flat or substantially flat). In more detail, the upper surface of the organic encapsulation layer 420 corresponding to the display area DA may be approximately flat (e.g., may be flat or substantially flat). The organic encapsulation layer 420 may include a first organic material. The first organic material may include, for example, at least one of polyethylene terephthalate, polyethylene naphthalate, polycarbonate, polyimide, polyethylene sulfonate, polyoxymethylene, polyarylate, hexamethyldisiloxane, an epoxy resin, and an acrylic resin (e.g., polymethyl methacrylate, polyacrylic acid, and/or the like).

The second inorganic encapsulation layer 430 covers the organic encapsulation layer 420, and may include silicon oxide, silicon nitride, and/or silicon oxynitride. The second inorganic encapsulation layer 430 may prevent or substantially prevent the organic encapsulation layer 420 from being exposed to the outside, because the second inorganic encapsulation layer 430 contacts an edge of the first inorganic encapsulation layer 410 located outside the display area DA.

Because the encapsulation layer 400 has a multilayered structure including the first inorganic encapsulation layer 410, the organic encapsulation layer 420, and the second inorganic encapsulation layer 430, even if a crack occurs in the encapsulation layer 400, the crack may not be connected between the first inorganic encapsulation layer 410 and the organic encapsulation layer 420, or between the organic encapsulation layer 420 and the second inorganic encapsulation layer 430 through the multilayered structure. As such, the formation of a penetration path of external moisture and/or oxygen into the display area DA may be prevented or reduced. Because the organic light-emitting device may be easily damaged by moisture and/or oxygen from the outside, the encapsulation layer 400 may cover and protect the organic light-emitting device and/or the low reflection layer 300.

The organic encapsulation layer 420 may include a dye. Accordingly, the organic encapsulation layer 420 may absorb some of the incident light incident from the outside, or may absorb some of reflected light that proceeds to the outside after the incident light from the outside is reflected by structures below the organic encapsulation layer 420. Therefore, even if the display apparatus 1 does not include a retarder and/or a polarizer, external light reflection may be reduced. The dye may include, for example, a metal porphyrin compound, a methine compound, a triazine compound, a pyrromethene compound, a tetra-azaporphyrin compound, a phthalocyanine compound, and/or a suitable combination thereof.

The dye included in the organic encapsulation layer 420 is soluble in the first organic material, and may be dissolved in the first organic material. As used herein, the phrase "A is soluble in B" means that an attractive force between A particles is equal to or less than an attractive force between A and B particles or an attractive force between B particles. In addition, the phrase "A dissolves in B" means that A particles diffuse and are uniformly or substantially uniformly distributed in a material containing B. In other words, dye particles may be diffused in the first organic material and may be uniformly or substantially uniformly distributed in the first organic material.

On the other hand, when a layer in contact with the organic encapsulation layer 420 contains a material capable of dissolving the dye, the dye included in the organic encapsulation layer 420 may move to and contaminate the layer in contact with the organic encapsulation layer 420. However, according to the present embodiment, because the organic encapsulation layer 420 including the dye is surrounded (e.g., is enclosed) by the first inorganic encapsulation layer 410 and the second inorganic encapsulation layer 430, the dye included in the organic encapsulation layer 420 may be prevented or substantially prevented from passing through the first inorganic encapsulation layer 410 and/or the second inorganic encapsulation layer 430 and moving to another layer. In other words, because contamination between layers of the display apparatus 1 may be prevented or substantially prevented, chemical resistance of the display apparatus 1 may be improved.

The input sensing layer 500 may be on the encapsulation layer 400. In more detail, the input sensing layer 500 may be between the encapsulation layer 400 and a light blocking layer 600. A first refractive layer 710 may be on the light blocking layer 600. The input sensing layer 500 may obtain coordinate information according to an external input, for example, such as a touch event of an object such as a finger or a stylus pen. The input sensing layer 500 may include sensing electrodes and/or trace lines. The input sensing layer 500 may sense the external input using a mutual capacitance method or a self-capacitance method.

The input sensing layer 500 may include a first touch-insulating layer 510, a first conductive layer 521, a second touch-insulating layer 530, and a second conductive layer 522. The first conductive layer 521 and the second conductive layer 522 may include sensing electrodes and/or trace lines. The first touch-insulating layer 510 may be between the encapsulation layer 400 and the first conductive layer 521, and the second touch-insulating layer 530 may be between the first conductive layer 521 and the second conductive layer 522.

The first conductive layer 521 and the second conductive layer 522 may each be a single layer or multiple layers including a conductive material. The conductive material may include Mo, Al, copper (Cu), or Ti. For example, the first conductive layer 521 and the second conductive layer 522 may each have a three-layer structure of Ti/Al/Ti.

The first touch-insulating layer 510 and the second touch-insulating layer 530 may include an inorganic insulating material and/or an organic insulating material. The inorganic insulating material may include silicon oxide, silicon nitride, and/or silicon oxynitride. The organic insulating material may include an acryl-based or imide-based organic material.

The light blocking layer 600 may be on the input sensing layer 500. In more detail, the light blocking layer 600 may be disposed to cover the second conductive layer 522. The light blocking layer 600 may include a second opening 600OP corresponding to an emission area EA of the display element 290. The light blocking layer 600 may have a plurality of second openings 600OP to have a grid shape or a mesh shape. A width (e.g., in the x direction or the y direction) of the second opening 600OP of the light blocking layer 600 may be greater than a width (e.g., in the x direction or the y direction) of the first opening 280OP of the pixel-defining layer 280. A shape of the second opening 600OP of the light blocking layer 600 may be the same or substantially the same as a shape of the first opening 280OP of the pixel-defining layer 280.

The light blocking layer 600 may include a light blocking material, for example, such as a black material. The light blocking material may include carbon black, carbon nanotubes, a resin or paste containing a black dye, or metal particles. The metal particles may be, for example, nickel, aluminum, molybdenum, and/or suitable alloys thereof. In addition, the light blocking material may include metal oxide particles such as chromium oxide, or metal nitride particles such as chromium nitride. Because the light blocking layer 600 includes the light blocking material, reflection of external light by metal structures below the light blocking layer 600 may be reduced. If necessary or desired, the light blocking layer 600 may include the same or substantially the same material as that of the pixel defining layer 280 disposed therebelow. However, the present disclosure is not limited thereto, and the light blocking layer 600 may include a material different from that of the pixel-defining layer 280.

The refractive layer 700 may be on the display element 290, for example, such as on the input sensing layer 500. The refractive layer 700 may control a path of light emitted from the emission layer of the display element 290, and may serve as a condensing lens. The refractive layer 700 may change a path of light that travels in a lateral direction (e.g., a direction other than the +z direction) from among the light emitted from the emission layer of the display element 290, to advance in a direction (e.g., the +z direction) that is perpendicular to or substantially perpendicular to a surface (e.g., the top surface) of the substrate 100. The refractive layer 700 may include a first refractive layer 710 and a second refractive layer 720.

The first refractive layer 710 may be on the light blocking layer 600. The first refractive layer 710 may have a third opening 710OP corresponding to the second opening 600OP of the light blocking layer 600. Accordingly, the third opening 710OP of the first refractive layer 710 may correspond to the emission area EA of the display element 290. In other words, the first refractive layer 710 may have a grid shape or a mesh shape by including a plurality of third openings 710OP. A width (e.g., in the x direction or the y direction) of the third opening 710OP of the first refractive layer 710 may be greater than the width (e.g., in the x direction or the y direction) of the first opening 280OP of the pixel-defining layer 280, and less than the width (e.g., in the x direction or the y direction) of the second opening 600OP of the light blocking layer 600. A shape of the third opening 710OP of the first refractive layer 710 may be the same or substantially the same as the shapes of the first opening 280OP of the pixel-defining layer 280 and the second opening 600OP of the light blocking layer 600.

The first refractive layer 710 may include a light-transmitting inorganic material or an organic material having a low refractive index. For example, the inorganic material may include silicon oxide, magnesium fluoride, and/or the like. The organic material may include at least one of acrylic, polyimide, polyamide, and Alq3 (Tris(8-hydroxyquinolinato)aluminum). A first refractive index of the first refractive layer 710 may be less than 1.6. For example, the first refractive index may be greater than 1.3 and less than 1.6. However, the present disclosure is not limited thereto.

The second refractive layer 720 may be on the first refractive layer 710, and may fill the third opening 710OP of the first refractive layer 710. For example, the second refractive layer 720 may cover the first refractive layer 710. The second refractive layer 720 may cover an entirety of an upper surface of the substrate 100, and the upper surface of the second refractive layer 720 may be flat or substantially flat.

The second refractive layer 720 may include a second organic material. The second organic material may include at least one of polyethylene terephthalate, polyethylene naphthalate, polycarbonate, polyimide, polyethylene sulfonate, polyoxymethylene, polyarylate, hexamethyldisiloxane, an epoxy resin, and an acrylic resin (e.g., polymethyl methacrylate, polyacrylic acid, and/or the like). The dye included in the organic encapsulation layer 420 may be soluble in the second organic material. In other words, dye particles may be diffused in the second organic material, and may be uniformly or substantially uniformly distributed in the second organic material. However, in the case of the display apparatus 1 according to the present embodiment, the second refractive layer 720 may not include a dye. Accordingly, even if a layer in contact with the second refractive layer 720 contains a material in which the dye may be dissolved, the dye does not move to and contaminate the layer in contact with the second refractive layer 720. Accordingly, because contamination between the layers of the display apparatus 1 may be prevented or substantially prevented, chemical resistance of the display apparatus 1 may be improved.

The second refractive layer 720 may include a plurality of highly refractive particles 730 dispersed in the second organic material. The highly refractive particles 730 may include a metal oxide, such as zirconium oxide, zinc oxide, titanium oxide, niobium oxide, tantalum oxide, tin oxide, nickel oxide, silicon nitride, indium nitride, gallium nitride, and/or the like. The highly refractive particles 730 may be dispersed in the second refractive layer 720 in a spherical or amorphous shape. When the highly refractive particles 730 are spherically dispersed in the second refractive layer 720, an average diameter of the highly refractive particles 730 may be 5 nm to 30 nm.

Because the second refractive layer 720 includes the highly refractive particles 730, the second refractive layer 720 may have a second refractive index greater than the first refractive index of the first refractive layer 710. The second refractive index of the second refractive layer 720 may be greater than 1.6. The second refractive index may be, for example, greater than 1.6 and less than 2.0, but the present disclosure is not limited thereto.

In addition, the second refractive layer 720 may include a pigment 900. The pigment 900 may include, for example, pigment red 177 (C.I Pigment red 177), pigment green 7 (C.I Pigment Green 7), pigment green 59 (C.I Pigment Green 59), pigment yellow 185 (C.I Pigment Yellow 185), and/or pigment blue 15:6 (C.I Pigment Blue 15:6). The pigment 900 is insoluble in the second organic material, and may be evenly or substantially evenly dispersed in the second organic material. As used herein, the phrase "A is insoluble in B" means that an attractive force between A particles is greater than an attractive force between the A particles and B particles or an attractive force between B particles. In addition, the phrase "A is evenly dispersed in B" means that A fine particles having a size in a suitable range (e.g., a specific or predetermined range) are mixed in a dispersion medium B without agglomeration. In other words, the pigment 900 may not be dissolved in the second organic material, but may be evenly or substantially evenly dispersed in the second organic material in the form of fine particles.

Accordingly, the pigment 900 having the form of fine particles is dispersed in the second refractive layer 720 to generate a similar effect as that of the highly refractive particles 730. In other words, the pigment 900 may increase the second refractive index of the second refractive layer 720. In addition, because the pigment 900 is not dissolved in the second organic material, the pigment 900 is not easily diffused or moved in the second refractive layer 720. Furthermore, even if the pigment 900 included in the second refractive layer 720 moves to a layer in contact with the second refractive layer 720, the pigment 900 may not contaminate the layer. Accordingly, because contamination between the layers of the display apparatus 1 may be prevented or substantially prevented, chemical resistance of the display apparatus 1 may be improved.

The protective layer 800 may be on the second refractive layer 720. The protective layer 800 may include a protective film and an adhesive material. The protective film may include a plastic film, for example, such as polyethylene terephthalate. The adhesive material may include, for example, a silicone-based adhesive material or a urethane-based adhesive material. However, the present disclosure is not limited thereto.

The dye may be soluble in the protective film and/or the adhesive material included in the protective layer 800. In other words, when a layer including dye particles is in contact with the protective layer 800, the dye particles may migrate into the protective film and/or the adhesive material included in the protective layer 800 to contaminate the protective film and/or the adhesive material. For example, when the second refractive layer 720 that is in contact with the protective layer 800 includes a dye, the dye may move to and contaminate the passivation layer 800, and may chemically react with the passivation layer 800.

However, in the case of the display apparatus 1 according to the present embodiment, the dye is located in the organic encapsulation layer 420, and the second refractive layer 720 does not include a dye. Therefore, even if the passivation layer 800 that is in contact with the second refractive layer 720 contains a material capable of dissolving a dye, the dye does not move to and contaminate the passivation layer 800. Accordingly, because contamination between the layers of the display apparatus 1 may be prevented or substantially prevented, chemical resistance of the display apparatus 1 may be improved.

Figure 3:
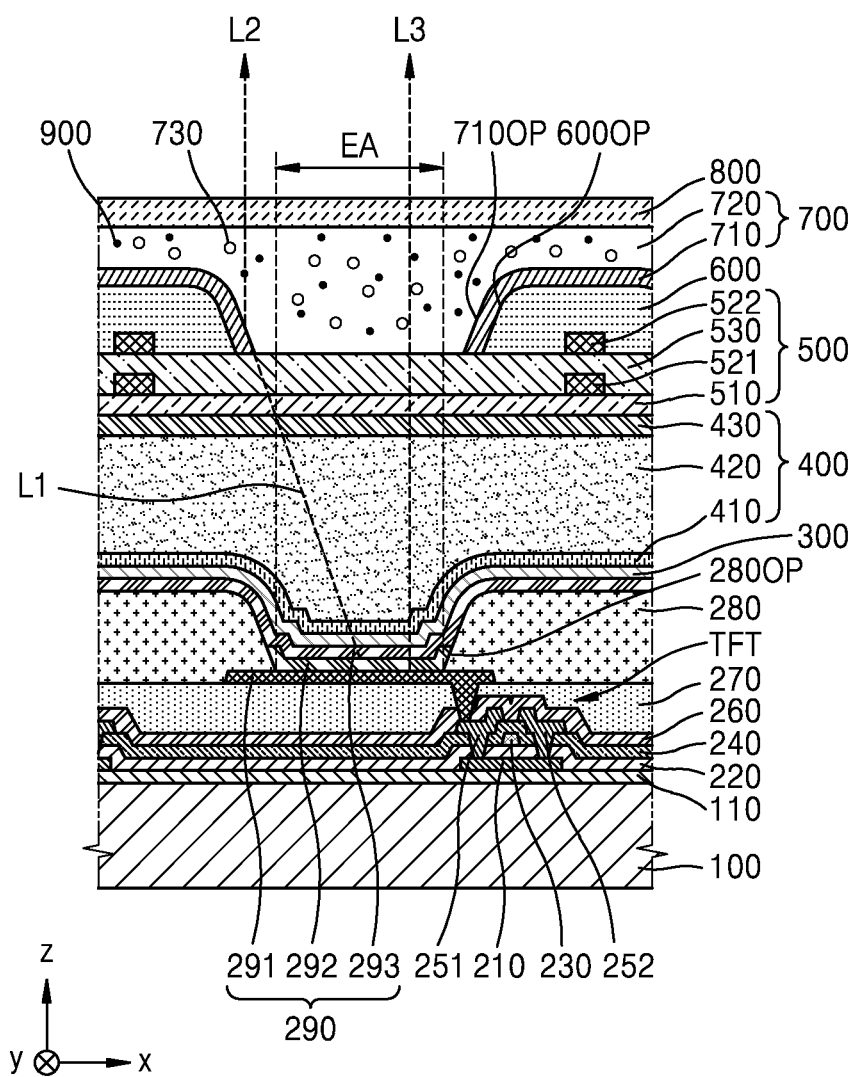
FIG. 3 is a cross-sectional view schematically illustrating light extraction efficiency of a display apparatus according to an embodiment.

FIG. 3 is a cross-sectional view schematically illustrating a portion of a display apparatus according to an embodiment. In more detail, FIG. 3 is a cross-sectional view schematically illustrating light extraction efficiency of the display apparatus 1 according to an embodiment. As shown in FIG. 3, a width (e.g., in the x direction or they direction) of the bottom of the third opening 710OP may be greater than a width (e.g., in the x direction or the y direction) of the bottom of the first opening 280OP, and less than a width (e.g., in the x direction or the y direction) of the bottom of the second opening 600OP. The width may refer to the maximum width of the bottom of the corresponding opening. However, the present disclosure is not limited thereto.

Light emitted from the display element 290 may include light L1 that is obliquely incident toward a side surface of the first refractive layer 710, and light L3 that passes through the second refractive layer 720 and is extracted in a direction (e.g., the +z direction) that is perpendicular to or substantially perpendicular to the substrate 100 (e.g., to the top surface of the substrate 100) without changing the direction. From among the light emitted from the display element 290, the light L1 incident toward the inclined side surface of the first refractive layer 710 may be totally reflected at an interface between the first refractive layer 710 and the second refractive layer 720 to change an optical path thereof. From the total reflection of the light L1, totally reflected light L2 may be extracted in the direction (e.g., the +z direction) that is perpendicular to or substantially perpendicular to the substrate 100. In other words, by the total reflection of the light L1 at the interface between the first refractive layer 710 having a first refractive index and the second refractive layer 720 having a second refractive index greater than the first refractive index, front light extraction efficiency may be improved, and thus, front visibility may be improved.

Figure 4:
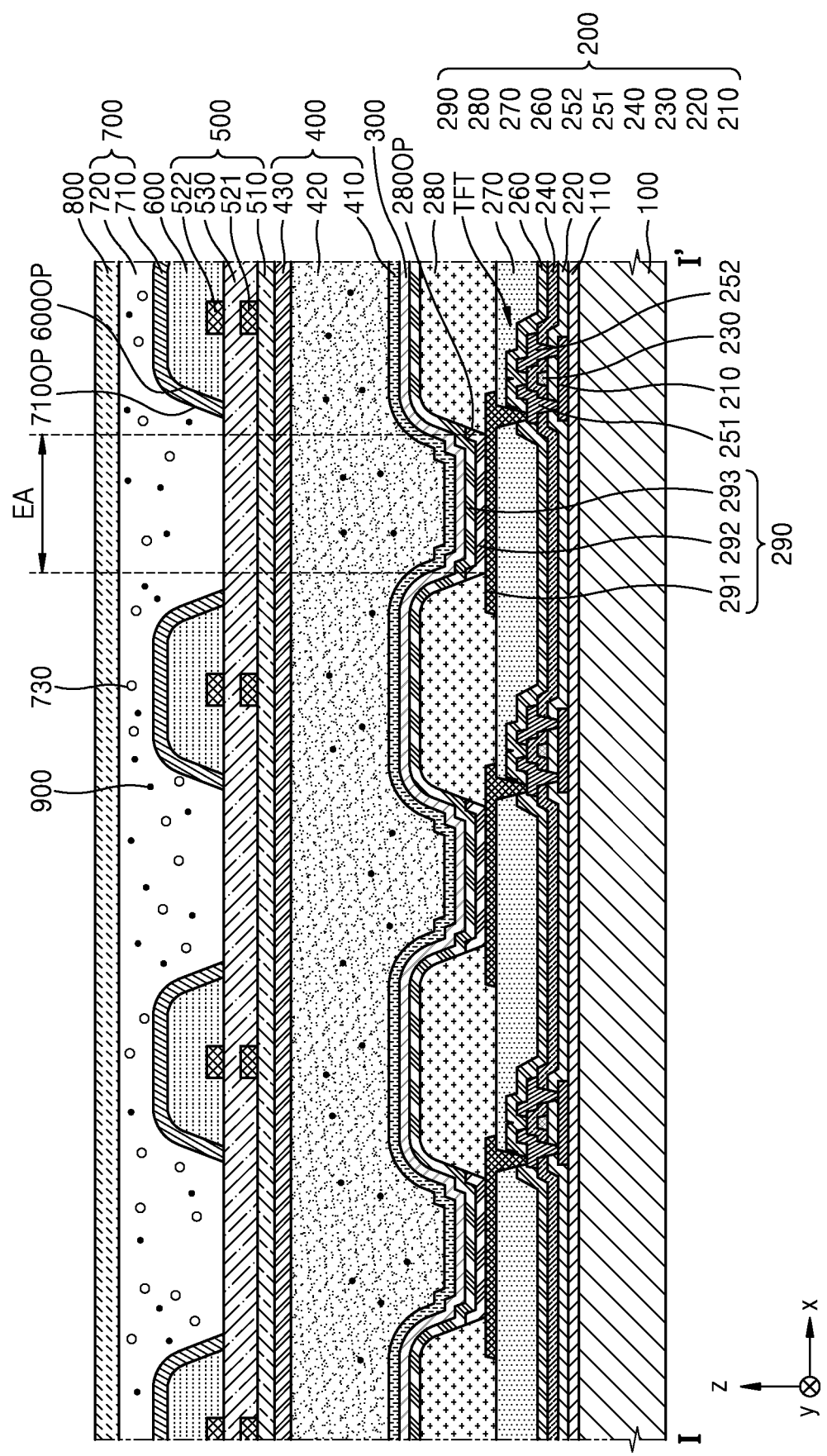
FIG. 4 is a cross-sectional view schematically illustrating a portion of a display apparatus according to an embodiment.

FIG. 4 is a cross-sectional view schematically illustrating a portion of a display apparatus according to an embodiment.

According to one or more embodiments described above, the organic encapsulation layer 420 includes the dye, and the second refractive layer 720 includes the pigment 900. However, the present disclosure is not limited thereto. For example, referring to FIG. 4, in some embodiments, the organic encapsulation layer 420 may include some pigments 900, in addition to the dye, and the second refractive layer 720 may include some of the pigments 900.

Even in the embodiment shown in FIG. 4, because the organic encapsulation layer 420 including the dye is surrounded (e.g., is enclosed) by the first inorganic encapsulation layer 410 and the second inorganic encapsulation layer 430, the dye included in the organic encapsulation layer 420 may be prevented or substantially prevented from passing through the first inorganic encapsulation layer 410 and/or the second inorganic encapsulation layer 430 and moving to another layer. Accordingly, because contamination between the layers of the display apparatus 1 may be prevented or substantially prevented, chemical resistance of the display apparatus 1 may be improved. Furthermore, some of the pigments 900 included in the second refractive layer 720 increases a refractive index of the second refractive layer 720. However, compared to the case where the second refractive layer 720 includes all of the pigments 900 as shown in FIG. 2, the refractive index of the second refractive layer 720 may be relatively low.

On the other hand, compared to the case where the second refractive layer 720 includes all of the pigments 900 as shown in FIG. 2, because some of the pigments 900 is included in the organic encapsulation layer 420, the display apparatus 1 also has the same or similar external light reflectance. In other words, by adjusting the amount of the pigments 900 included in each of the organic encapsulation layer 420 and the second refractive layer 720, the display apparatus 1 may have the same or similar external light reflectance as the case where the second refractive layer 720 includes all of the pigments 900, and the refractive index of the second refractive layer 720 may be appropriately adjusted.

Figure 5:
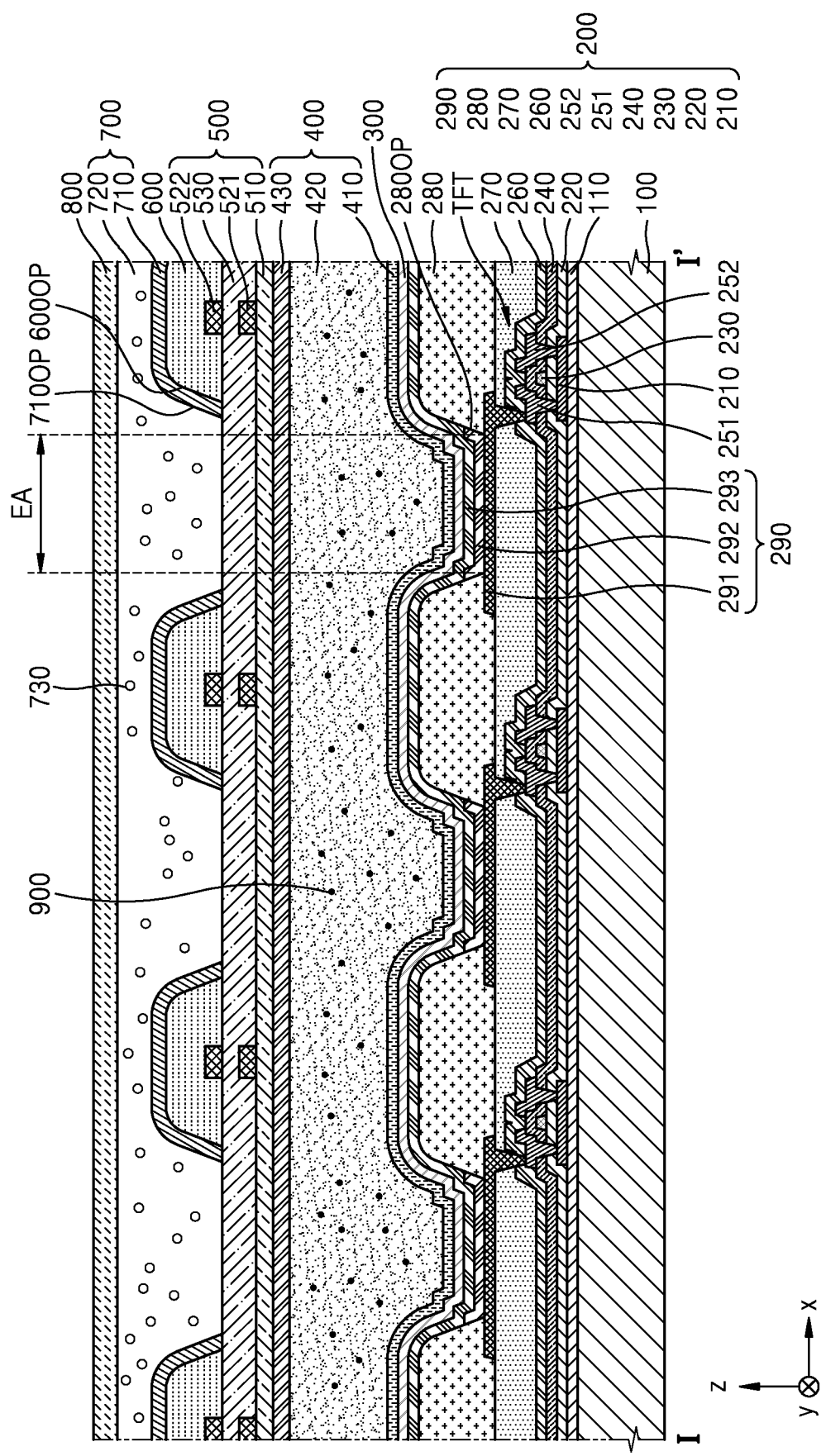
FIG. 5 is a cross-sectional view schematically illustrating a portion of a display apparatus according to an embodiment.

FIG. 5 is a cross-sectional view schematically illustrating a portion of a display apparatus according to an embodiment.

For example, as shown in FIG. 5, in some embodiments, the organic encapsulation layer 420 may include both the pigments 900 and the dye, and the second refractive layer 720 may include neither the pigments 900 nor the dye.

Even in the embodiment shown in FIG. 5, because the organic encapsulation layer 420 including the dye is surrounded (e.g., is enclosed) by the first inorganic encapsulation layer 410 and the second inorganic encapsulation layer 430, the dye included in the organic encapsulation layer 420 may be prevented or substantially prevented from passing through the first inorganic encapsulation layer 410 and/or the second inorganic encapsulation layer 430 and moving to another layer. In addition, the dye is located in the organic encapsulation layer 420, and the second refractive layer 720 does not include the dye. Therefore, even if the passivation layer 800 that is in contact with the second refractive layer 720 contains a material capable of dissolving the dye, the dye does not move to and contaminate the passivation layer 800. Accordingly, because contamination between the layers of the display apparatus 1 may be prevented or substantially prevented, chemical resistance of the display apparatus 1 may be improved.

Figure 6:
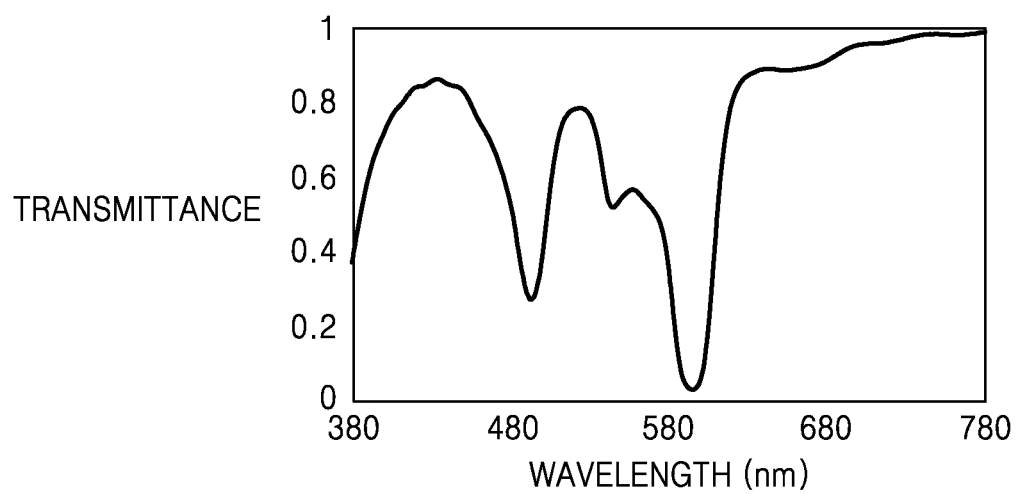
FIGS. 6-7 are graphs illustrating transmittances according to wavelengths of a second refractive layer including a pigment, and an encapsulation layer including a dye of a display apparatus according to an embodiment.

FIG. 6 is a graph illustrating a transmittance according to a wavelength of the organic encapsulation layer 420 including a dye of the display apparatus 1 according to an embodiment. In more detail, FIG. 6 is a graph showing transmittance in the case of the organic encapsulation layer 420 including FDB-002™ (Yamada Kagaku Kogyo Co., Ltd.) or NEC594™ (Ukseung Chemicals) as the dye.

The organic encapsulation layer 420 including the above-described dye may absorb light of at least some wavelength bands that do not belong to a main wavelength range of the light emitted from the display element 290. The display element 290 may emit red, green, blue, or white light. In this case, a wavelength band of the blue light emitted by the display element 290 may be about 430 nm to about 480 nm, a wavelength band of the green light emitted from the display element 290 may be about 510 nm to about 575 nm, and a wavelength band of the red light emitted by the display element 290 may be about 605 nm to about 650 nm. Accordingly, the organic encapsulation layer 420 may absorb light in at least one of a first wavelength band that is less than about 430 nm, a second wavelength band that is greater than about 480 nm and less than 510 nm, a third wavelength band that is greater than about 575 nm and less than 605 nm, and a fourth wavelength band that is greater than 650 nm. For example, absorbance of the dye included in the organic encapsulation layer 420 with respect to the light in the third wavelength band of greater than 575 nm and less than 605 nm may be greater than the absorbance of the dye included in the organic encapsulation layer 420 with respect to the light in the wavelength band of 605 nm to 650 nm. However, the present disclosure is not limited thereto.

For example, the organic encapsulation layer 620 may include at least one of a first dye for absorbing the light in the first wavelength band, a second dye for absorbing the light in the second wavelength band, a third dye for absorbing the light in the third wavelength band, and a fourth dye for absorbing the light in the fourth wavelength band. The first dye may include (e.g., may be) a metal porphyrin compound, a methine compound, a triazine compound, and/or suitable combinations thereof. The second dye may include (e.g., may be) a pyrromethene compound. The third dye may include (e.g., may be) a tetra-azaporphyrin compound. The fourth dye may include (e.g., may be) a phthalocyanine compound. However, the present disclosure is not limited thereto. FDB-002™ (Yamada Kagaku Kogyo Co., Ltd.) included in the organic encapsulation layer 420 of the display apparatus 1 according to the present embodiment is the first dye, and NEC594™ (Ukseung Chemicals) included in the organic encapsulation layer 420 of the display apparatus 1 according to the present embodiment is the third dye. Accordingly, as shown in FIG. 6, the organic encapsulation layer 420 absorbs the light in the first wavelength band of less than about 430 nm, and the light in the third wavelength band of greater than about 575 nm and less than about 605 nm.

When the organic encapsulation layer 420 includes at least two of the first dye, the second dye, the third dye, and the fourth dye, the quality of an image implemented in the display apparatus may be improved. When the dye included in the organic encapsulation layer 420 absorbs only external light belonging to the first wavelength band of less than about 430 nm, in the reflected light incident from the display apparatus, the amount of light belonging to the third wavelength band of greater than about 575 nm and less than about 605 nm is relatively greater than the amount of light belonging to the first wavelength band of less than about 430 nm. Accordingly, a user may recognize that the external light is relatively red, which may result in recognizing that the image implemented in the display apparatus is red as a whole. Therefore, by allowing the organic encapsulation layer 420 to include at least two of the first dye, the second dye, the third dye, and the fourth dye, the quality of the image implemented in the display apparatus may be significantly improved.

Figure 7:
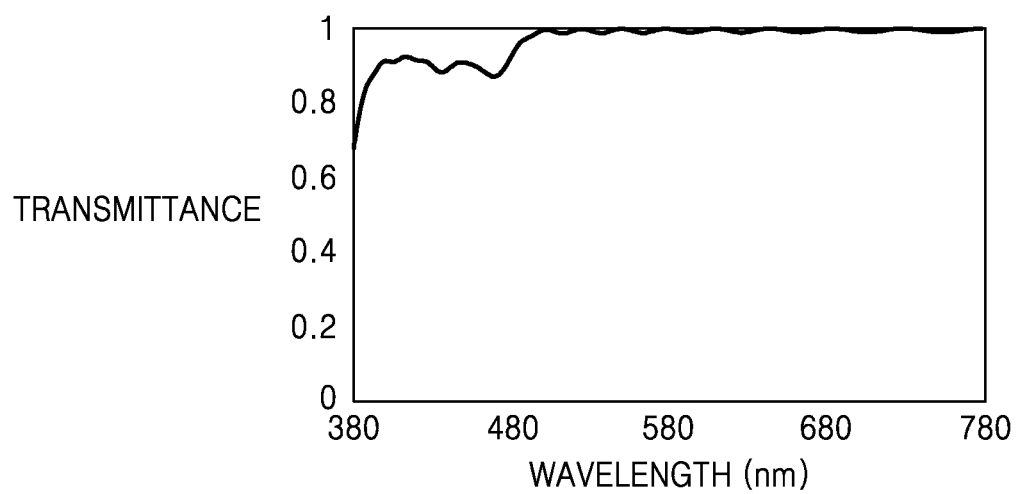

FIG. 7 is a graph illustrating a transmittance according to a wavelength of the second refractive layer 720 including a pigment of the display apparatus 1 according to an embodiment. In more detail, the graph of FIG. 7 illustrates a transmittance when the second refractive layer 720 includes pigment yellow 185 (C.I Pigment Yellow 185) as the pigment 900.

The second refractive layer 720 of the display apparatus 1 according to the present embodiment absorbs light in a wavelength range of 380 nm to 480 nm. For example, absorbance of the pigment 900 included in the second refractive layer 720 with respect to light in a wavelength band of 380 nm to 480 nm may be greater than absorbance of the pigment 900 included in the second refractive layer 720 with respect to light in a wavelength band of 605 nm to 650 nm. However, the present disclosure is not limited thereto. By including the second refractive layer 720 containing the pigment 900, the display apparatus 1 including the organic encapsulation layer 420 containing the dye has the same or similar external light reflectance as that of the display apparatus 1 including the second refractive layer 720 containing a dye and the pigment 900.

Figure 8:
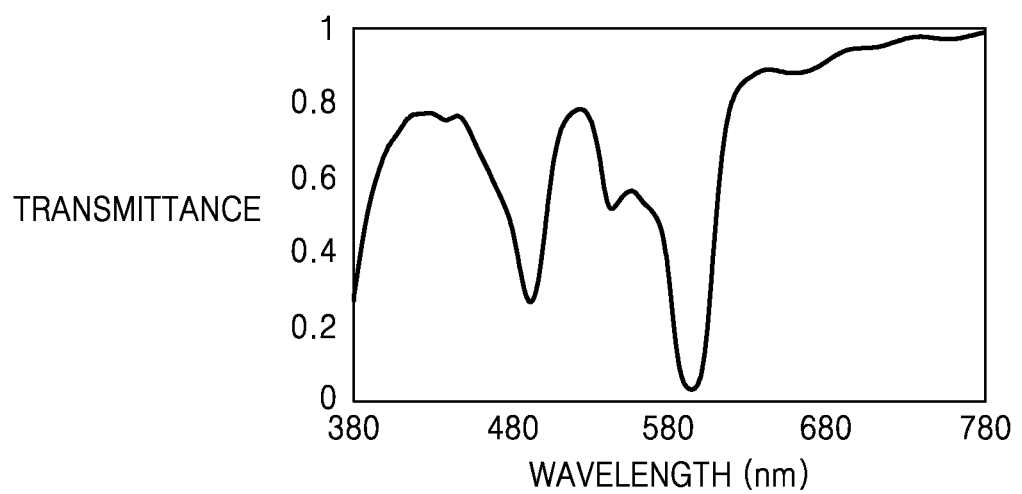
FIG. 8 is a graph illustrating a transmittance according to a wavelength of a second refractive layer including a pigment and a dye of a comparative example.

FIG. 8 is a graph illustrating a transmittance according to a wavelength of the second refractive layer 720 in a display apparatus according to a comparative example, in which the second refractive layer 720 includes both a dye and a pigment. In more detail, the graph of FIG. 8 is a graph illustrating the transmittance when the second refractive layer 720 including both a dye and a pigment includes FDB-002™ (Yamada Kagaku Kogyo Co., Ltd.) and NEC594™ (Ukseung Chemicals) as the dye, and pigment yellow 185 (C.I Pigment Yellow 185) as the pigment 900.

As shown in FIG. 8, the second refractive layer 720 of the comparative example absorbs light in a first wavelength range of 350 nm to 430 nm and a third wavelength range of 575 nm to 605 nm. Comparing the graphs of FIGS. 6 and 8, the organic encapsulation layer 420 of the display apparatus 1 according to an embodiment of the present disclosure and the second refractive layer 720 of the display apparatus according to the comparative example have a difference in light absorbance in a wavelength area of 380 nm to 480 nm. However, as shown in FIG. 7, because the second refractive layer 720 of the display apparatus 1 according to an embodiment absorbs light in the wavelength area of 380 nm to 480 nm, the light absorbance in the 380 nm to 480 nm wavelength area of the display apparatus 1 according to an embodiment having an organic encapsulation layer including a dye and a second refractive layer including a pigment is the same as or similar to the light absorbance in the 380 nm to 480 nm wavelength area of the display apparatus according to the comparative example. Therefore, the display apparatus 1 according to an embodiment having the organic encapsulation layer including a dye and the second refractive layer including a pigment has the same or similar external light reflectance to that of the display apparatus according to the comparative example in which the second refractive layer 720 includes both the dye and the pigment.

According to one or more embodiments of the present disclosure as described above, a display apparatus capable of reducing contamination between the layers thereof may be implemented. However, the spirit and scope of the present disclosure is not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a substrate;
a display element on the substrate;
an encapsulation layer on the display element, and comprising a dye and a first organic material;
a first refractive layer on the encapsulation layer, and having an opening corresponding to the display element; and
a second refractive layer covering the first refractive layer, the second refractive layer comprising a pigment and a second organic material, and having a refractive index different from a refractive index of the first refractive layer.

2. The display apparatus of claim 1, wherein the dye is soluble in the second organic material, and
wherein the second refractive layer does not include the dye.

3. The display apparatus of claim 1, wherein an absorbance of the dye with respect to light in a wavelength band of greater than 575 nm and less than 605 nm is greater than an absorbance of the dye with respect to light in a wavelength band of 605 nm to 650 nm.

4. The display apparatus of claim 1, wherein the pigment is insoluble in the second organic material.

5. The display apparatus of claim 1, wherein an absorbance of the pigment with respect to light in a wavelength band of 380 nm to 480 nm is greater than an absorbance of the pigment with respect to light in a wavelength band of 605 nm to 650 nm.

6. The display apparatus of claim 1, wherein the refractive index of the second refractive layer is greater than the refractive index of the first refractive layer.

7. The display apparatus of claim 6, wherein the second refractive layer comprises highly refractive particles including a metal oxide.

8. The display apparatus of claim 1, wherein the second refractive layer fills the opening of the first refractive layer.

9. The display apparatus of claim 1, wherein the encapsulation layer comprises a first inorganic encapsulation layer, an organic encapsulation layer on the first inorganic encapsulation layer, and a second inorganic encapsulation layer covering the organic encapsulation layer, and
wherein the organic encapsulation layer comprises the dye and the first organic material.

10. The display apparatus of claim 1, further comprising a low-reflection layer between the display element and the encapsulation layer, and comprising an inorganic material.

11. The display apparatus of claim 1, further comprising an input sensing layer between the encapsulation layer and the first refractive layer, and comprising a sensing electrode.

12. The display apparatus of claim 1, further comprising a protective layer on the second refractive layer, and comprising a protective film and an adhesive material.

13. The display apparatus of claim 1, wherein the encapsulation layer further comprises the pigment.

14. A display apparatus comprising:
a substrate;
a display element on the substrate;
an encapsulation layer on the display element, and comprising a dye, a pigment, and a first organic material;
a first refractive layer on the encapsulation layer, and having an opening corresponding to the display element; and
a second refractive layer covering the first refractive layer, the second refractive layer comprising a second organic material, and having a refractive index different from a refractive index of the first refractive layer.

15. The display apparatus of claim 14, wherein the dye is soluble in the second organic material, and
wherein the second refractive layer does not include the dye.

16. The display apparatus of claim 14, wherein an absorbance of the dye with respect to light in a wavelength band of greater than 575 nm and less than 605 nm is greater than an absorbance of the dye with respect to light in a wavelength band of 605 nm to 650 nm.

17. The display apparatus of claim 14, wherein the pigment is insoluble in the second organic material.

18. The display apparatus of claim 14, wherein an absorbance of the pigment with respect to light in a wavelength band of 380 nm to 480 nm is greater than an absorbance of the pigment with respect to light in a wavelength band of 605 nm to 650 nm.

19. The display apparatus of claim 14, wherein the refractive index of the second refractive layer is greater than the refractive index of the first refractive layer.

20. The display apparatus of claim 19, wherein the second refractive layer comprises highly refractive particles including a metal oxide.

21. The display apparatus of claim 14, wherein the second refractive layer fills the opening of the first refractive layer.

22. The display apparatus of claim 14, wherein the encapsulation layer comprises a first inorganic encapsulation layer, an organic encapsulation layer on the first inorganic encapsulation layer, and a second inorganic encapsulation layer covering the organic encapsulation layer, and
wherein the organic encapsulation layer comprises the dye, the pigment, and the first organic material.

23. The display apparatus of claim 14, further comprising a low-reflection layer between the display element and the encapsulation layer, and comprising an inorganic material.

24. The display apparatus of claim 14, further comprising an input sensing layer between the encapsulation layer and the first refractive layer, and comprising a sensing electrode.

25. The display apparatus of claim 14, further comprising a protective layer on the second refractive layer, and comprising a protective film and an adhesive material.

* * * * *